Figure 1:
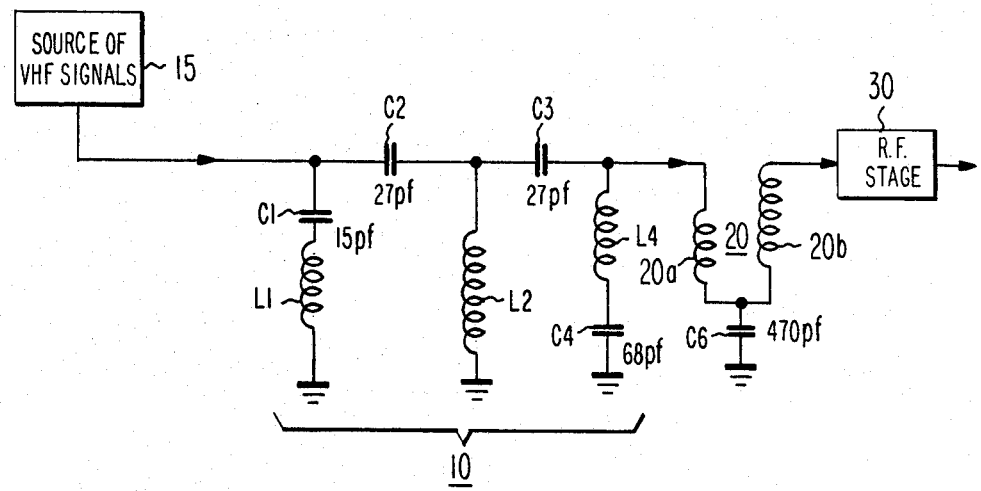

United States Patent [19]

Sakarya

[11] Patent Number: 4,642,691
[45] Date of Patent: Feb. 10, 1987

[54] TELEVISION SIGNAL INPUT FILTER

[75] Inventor: Dursun Sakarya, Indianapolis, Ind.

[73] Assignee: RCA Corporation, Princeton, N.J.

[21] Appl. No.: 705,494

[22] Filed: Feb. 28, 1985

[51] Int. Cl.$^4$ .......................... H04N 5/21; H04N 5/44
[52] U.S. Cl. .................................... 358/188; 358/166; 358/196; 333/176; 455/302; 455/307
[58] Field of Search ............... 358/188, 196, 166, 167; 455/213, 271, 302, 307, 310, 311; 333/175, 176

[56] References Cited

U.S. PATENT DOCUMENTS

| 3,204,025 | 8/1965 | Przybyszewski | 358/196 |
| 3,217,096 | 11/1965 | Caprio | 455/307 |
| 4,263,619 | 4/1981 | Theriault | 358/196 |

FOREIGN PATENT DOCUMENTS 516252 5/1939 United Kingdom .

OTHER PUBLICATIONS

1982 Basic Service Data Bulletin for the RCA CTC-121 television receiver, FIG. 18.

Primary Examiner—Tommy P. Chin
Attorney, Agent, or Firm—P. J. Rasmussen; P. M. Emanuel; R. H. Kurdyla

[57] ABSTRACT

An input filter for coupling television signals from a signal source such as an antenna to an RF signal processing stage includes series resonant input and output sections shunting the signal path. The input section forms a trap at the video IF frequency. The output section resonates at a frequency other than the sound IF frequency, below the band of television signal frequencies to be processed by the RF signal processing stage. The filter serves to attenuate unwanted stray signals such as video and sound IF components otherwise capable of interfering with and distorting the input television signals.

8 Claims, 2 Drawing Figures

TELEVISION SIGNAL INPUT FILTER

This invention concerns an input filter located between the television signal source and radio frequency signal processing circuits in a television receiver.

Television receivers often include an input bandpass filter located between the television signal input of the receiver and the radio frequency (RF) signal processing stage of the receiver. The RF stage commonly includes frequency selection, amplifier and mixer stages which produce intermediate frequency (IF) output signals as known. The input filter prevents unwanted broadcast signal frequencies outside of the television frequency band, e.g., communications frequencies such as used by police, fire and citizens band broadcast and receiving systems, from reaching and interfering with the RF circuits of the television receiver. The input filter also serves to prevent signal components associated with locally generated video IF and sound IF signal frequencies from interfering with the input television signals to be processed by the RF stage.

An input filter of the type described above is used, for example, in the CTC-121 color television receiver manufactured by the Consumer Electronics Division of RCA Corporation, Indianapolis, Ind., and is illustrated in FIG. 18 of the 1982 Color Television Basic Service Data bulletin for the CTC-121 receiver. The input filter for the CTC-121 receiver includes a pair of parallel resonant inductor-capacitor trap networks, respectively tuned to the 41.25 MHz sound IF frequency and to the 45.75 MHz video IF frequency, connected in series between the VHF television signal input of the receiver and a transformer which couples filter output signals to the RF stage of the receiver. This filter exhibits an unwanted resonance at approximately 300 MHz due to interaction between the inductive primary winding of the coupling transformer and capacitances associated with the filter network. The unwanted resonance can lead to undesirable image frequencies and image distortion, and is eliminated by means of a frequency selective network in addition to the input filter.

An input filter in accordance with the principles of the present invention desirably does not exhibit the aforementioned resonance in the vicinity of 300 MHz which requires additional circuitry to eliminate, and offers a very good attenuation characteristic with an economical, uncomplicated circuit topology.

The disclosed filter includes series resonant input and output sections shunting the signal path between the television signal source and RF signal processing stages. In a preferred embodiment of the invention, the input section is tuned to form a trap at the video IF frequency, and the output section is tuned to resonate at a frequency other than the sound IF frequency, below the band of television signal frequencies (e.g., low VHF band frequencies) to be processed by the RF stage.

Figure 2:
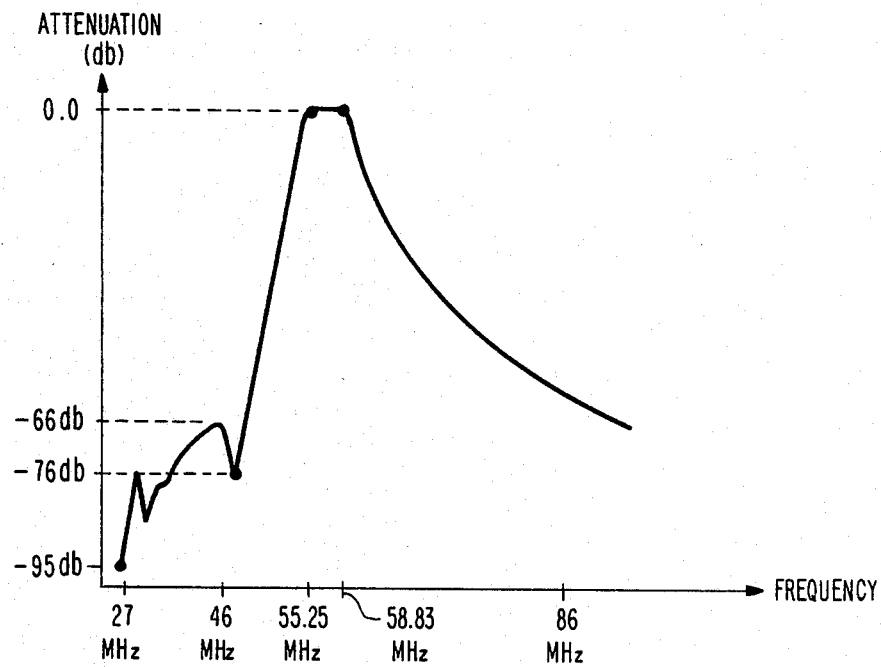

In the drawing:

FIG. 1 shows a portion of the VHF input section of a television receiver including an input filter in accordance with the principles of the present invention; and FIG. 2 illustrates an amplitude-versus-frequency response attributable to the filter shown in FIG. 1.

In FIG. 1, an input bandpass filter circuit 10 in accordance with the present invention receives input VHF television signals from a source 15. Source 15 may be an antenna for receiving broadcast television signals, or a source of cable television signals. In either case, more than one television receiver may be supplied with signals from source 15.

Filter 10 includes a series resonant inductor-capacitor network L1, C1 shunting the signal path and resonant at the 45.75 MHz video IF frequency. Network L1, C1, forms a video IF trap to prevent video IF components generated by an RF stage 30 from interfering with television signals supplied by source 15.

An intermediate filter section including series capacitors C2 and C3 in the signal path and an inductor L2 shunting the signal path serves as a high pass filter, with the value of inductor L2 being chosen to establish the corner frequency of such high pass filter.

High pass filtered signals from network C2, C3, L2 are coupled to an output section of filter 10 including a series resonant inductor-capacitor network L4, C4 shunting the signal path. After filtering by network L4, C4 the television signal is coupled to an inductive primary winding 20a of a coupling transformer 20, from a secondary winding 20b of which the television signal is coupled to RF stage 30. A capacitor C6 is coupled from the junction point of primary winding 20a and secondary winding 20b of transformer 20 to a point of reference potential. Transformer 20 primarily serves as an impedance transformation device for matching the relatively low impedance television input (e.g., 75 ohm or 300 ohm) to higher input impedance of RF stage 30.

Primary winding 20a of transformer 20 exhibits an inductance of approximately 110 nanohenrys, secondary winding 20b exhibits an inductance of approximately 650 nanohenrys, and transformer 20 exhibits a coupling coefficient of approximately 0.7. The values of inductors L1, L2 and L4 are approximately 400 nanohenrys, 200 nanohenrys and 600 nanohenrys, respectively, and are set to final values during manufacturing alignment of the receiver.

RF stage 30 includes frequency selection, amplifier and mixer stages for producing IF output signals which are afterwards coupled to detector circuits and other utilization circuits of the receiver. The video and sound IF signals produced by RF stage 30 can be undesirably coupled to source 15 via receiver chassis connections, e.g., chassis loops, and can interfere with and distort the television signals normally provided by source 15 to be processed by RF stage 30. When source 15 is a small portable receiving antenna attached to the receiver, for example, the IF signals conducted via the receiver chassis can be both radiated and received by such antenna as a distorted television signal. Filter 10 significantly attenuates the interfering IF components so that RF stage 30 receives only the television signal that it is intended to process.

The topology of filter 10, wherein input resonant section (trap) L1, C1 and output resonant section (trap) L4, C4 are series resonant and in shunt with the signal path, results in the elimination of the unwanted 300 MHz resonance experienced with an input filter of the type having parallel resonant, series connected trap sections as mentioned previously in connection with the CTC-121 television receiver.

In one configuration of filter 10, input section L1, C1 is tuned to resonate at the 41.25 MHz sound IF frequency, and output section L4, C4 is tuned to resonate at the 45.75 Mhz video IF frequency. This configuration results in an unwanted resonance at approximately 34 MHz, near the 41.25 MHz sound IF frequency, primarily due to interaction between the inductance of transformer primary winding 20a and the capacitive element of the output section. This configuration exhibits good attenuation of signal frequencies below 46 MHz i.e., below the low VHF band and encompassing the unwanted video and sound IF frequencies as well as the unwanted 27 MHz citizens band (CB) frequency.

A better attenuation characteristic was found to result, however, when input section L1, C1 is arranged to resonate at the 45.75 MHz video IF frequency, and the values of output section inductor L4 and capacitor C4 are selected to resonate at a frequency which nullifies the aforementioned 34 MHz resonance between primary winding 20a and capacitive element C4 of the output section. This has been found to occur when capacitor C4 and inductor L4 resonate at about 30 MHz in one example.

FIG. 2 illustrates an amplitude-versus-frequency response which is related to that of the latter configuration of filter 10. The response of FIG. 2 was measured at the mixer stage within RF stage 30, and reflects the fact that additional frequency selective networks are included between the output of transformer 20 and the mixer stage. However, it is noted that the shape of the response shown in FIG. 2 is primarily determined by the latter configuration of filter 10. The additional frequency selective networks add only a few additional db. of attenuation to the response otherwise determined by filter 10. The attenuation characteristic of filter 10 particularly below about 46 MHz is primarily determined by the input and output sections of filter 10.

FIG. 2 illustrates the amplitude-versus-frequency response with respect to channel 2 of the low VHF band. The peak response of FIG. 2 between 55.25 MHz and 58.83 MHz encompasses the channel 2 frequency band. As seen from FIG. 2, signal frequencies below 46 MHz, including the video IF frequency (45.75 MHz), the sound IF frequency (41.25 MHz), and the citizens band frequency (27 MHz) are greatly attenuated relative to the channel 2 band. The response of filter 10 is especially important relative to the low VHF band, and the channel 2 band in particular, due to the proximity of these frequency bands to the video and sound IF frequencies.

The last-mentioned configuration of filter 10 exhibits a very good attenuation characteristic of the 41.25 MHz sound IF frequency even though a sound IF trap is not specifically provided for. In this regard it is noted that filter 10 was found to exhibit a better attenuation characteristic by having the output section resonate at a frequency lower than the sound IF frequency.

The intermediate, high pass section of filter 10 comprising elements C2, C3 and L2 exhibits a cut-off frequency of approximately 48 MHz, i.e., below the channel 2 frequency band at the beginning of the low VHF band.

An input filter in accordance with the principles of the present invention can be used with respect to high VHF band and UHF band television frequencies in addition to low VHF band frequencies, depending upon the needs of a given receiver as relating to the amount of unwanted IF signal "feedback" via chassis loops, for example.

What is claimed is:

1. In a television signal processing system, apparatus comprising:
   a source of television signals;
   a radio frequency signal processing stage for processing a band of television signal frequencies to produce intermediate television signal frequencies including video and sound intermediate frequencies; and
   a bandpass filter responsive to said television signals for providing filtered television signals to said radio frequency processing stage via a signal path, wherein to prevent locally generated IF signal frequencies and unwanted broadcast signal frequencies outside of said band of television signal frequencies from reaching and interfering with the operation of said radio frequency signal processing stage, said filter comprises
   an input filter section comprising a series resonant circuit shunting said signal path;
   an output filter section comprising a series resonant circuit shunting said signal path; and
   an intermediate filter section with an input terminal for receiving signals from said input section and an output terminal for conveying signals to said output sectiun, said intermediate section including series impedance means between said input and output terminals and exhibiting a given transfer characteristic between said input terminals.

2. Apparatus according to claim 1, wherein
one of said input and output filter sections is resonant at said video intermediate frequency to form a trap at said video intermediate frequency; and
the other of said input and output filter sections is resonant at a frequency below said band of television signal frequencies to be processed by said radio frequency stage.

3. Apparatus according to claim 2, wherein
said one of said filter sections is said input filter section, and said other of said filter sections is said output filter section.

4. Apparatus according to claim 2, wherein
a transformer having input primary and output secondary windings couples output signals from said bandpass filter to said radio frequency processing stage.

5. Apparatus according to claim 2, wherein
said source corresponds to a source of low-band VHF television signals.

6. Apparatus according to claim 1, wherein
said input filter section comprises the series resonant combination of an inductance and a capacitance; and
said output filter section comprises the series resonant combination of an inductance and a capacitance.

7. Apparatus according to claim 6, wherein
said intermediate filter section is a high pass filter.

8. Apparatus according to claim 7, wherein
said intermediate filter section comprises first and second capacitances connected in series in said signal path between said input and output filter sections, and an inductance shunting a point between said first and second capacitances.

* * * * *

UNITED STATES PATENT AND TRADEMARK OFFICE
CERTIFICATE OF CORRECTION

PATENT NO. : 4,642,691

DATED : February 10, 1987

INVENTOR(S) : Dursun Sakarya

It is certified that error appears in the above-identified patent and that said Letters Patent is hereby corrected as shown below:

Column 4, line 25, Claim 1, "sectiun" should read --section--.

Column 4, line 28, Claim 1, insert --and output-- before "terminals".

Signed and Sealed this

Twenty-first Day of April, 1987

*Attest:*

DONALD J. QUIGG

*Attesting Officer*  *Commissioner of Patents and Trademarks*